(12) United States Patent
Schloesser et al.

(10) Patent No.: US 8,598,655 B1
(45) Date of Patent: Dec. 3, 2013

(54) SEMICONDUCTOR DEVICE AND METHOD FOR MANUFACTURING A SEMICONDUCTOR DEVICE

(75) Inventors: Till Schloesser, Munich (DE); Rolf Weis, Dresden (DE); Ralf Rudolf, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 13/566,742

(22) Filed: Aug. 3, 2012

(51) Int. Cl.
*H01L 29/08* (2006.01)
*H01L 29/417* (2006.01)
*H01L 29/78* (2006.01)

(52) U.S. Cl.
USPC .......... 257/334; 257/331; 257/332; 257/392; 257/E27.061; 438/272; 438/283

(58) Field of Classification Search
None
See application file for complete search history.

(56) References Cited

U.S. PATENT DOCUMENTS

| 6,812,526 | B2 * | 11/2004 | Blanchard | 257/343 |
| 7,812,409 | B2 * | 10/2010 | Hshieh | 257/401 |
| 8,030,705 | B2 * | 10/2011 | Jang | 257/335 |
| 2006/0118864 | A1 * | 6/2006 | Hirler et al. | 257/335 |
| 2007/0228496 | A1 * | 10/2007 | Rochefort et al. | 257/409 |
| 2009/0152667 | A1 * | 6/2009 | Rieger et al. | 257/488 |
| 2012/0175634 | A1 | 7/2012 | Weis | |
| 2012/0175635 | A1 | 7/2012 | Weis et al. | |

FOREIGN PATENT DOCUMENTS

DE 102007013848 A1 * 9/2008

* cited by examiner

*Primary Examiner* — Thomas L Dickey
*Assistant Examiner* — Joseph Schoenholtz
(74) *Attorney, Agent, or Firm* — Murphy, Bilak & Homiller, PLLC

(57) ABSTRACT

A semiconductor device includes a first transistor with a first drift zone, and a plurality of second transistors, each second transistor comprising a source region, a drain region and a gate electrode. The second transistors are electrically coupled in series to form a series circuit that is electrically coupled to the first transistor, the first and the plurality of second transistors being at least partially disposed in a semiconductor substrate including a buried doped layer, wherein the source or the drain regions of the second transistors are disposed in the buried doped layer.

20 Claims, 14 Drawing Sheets

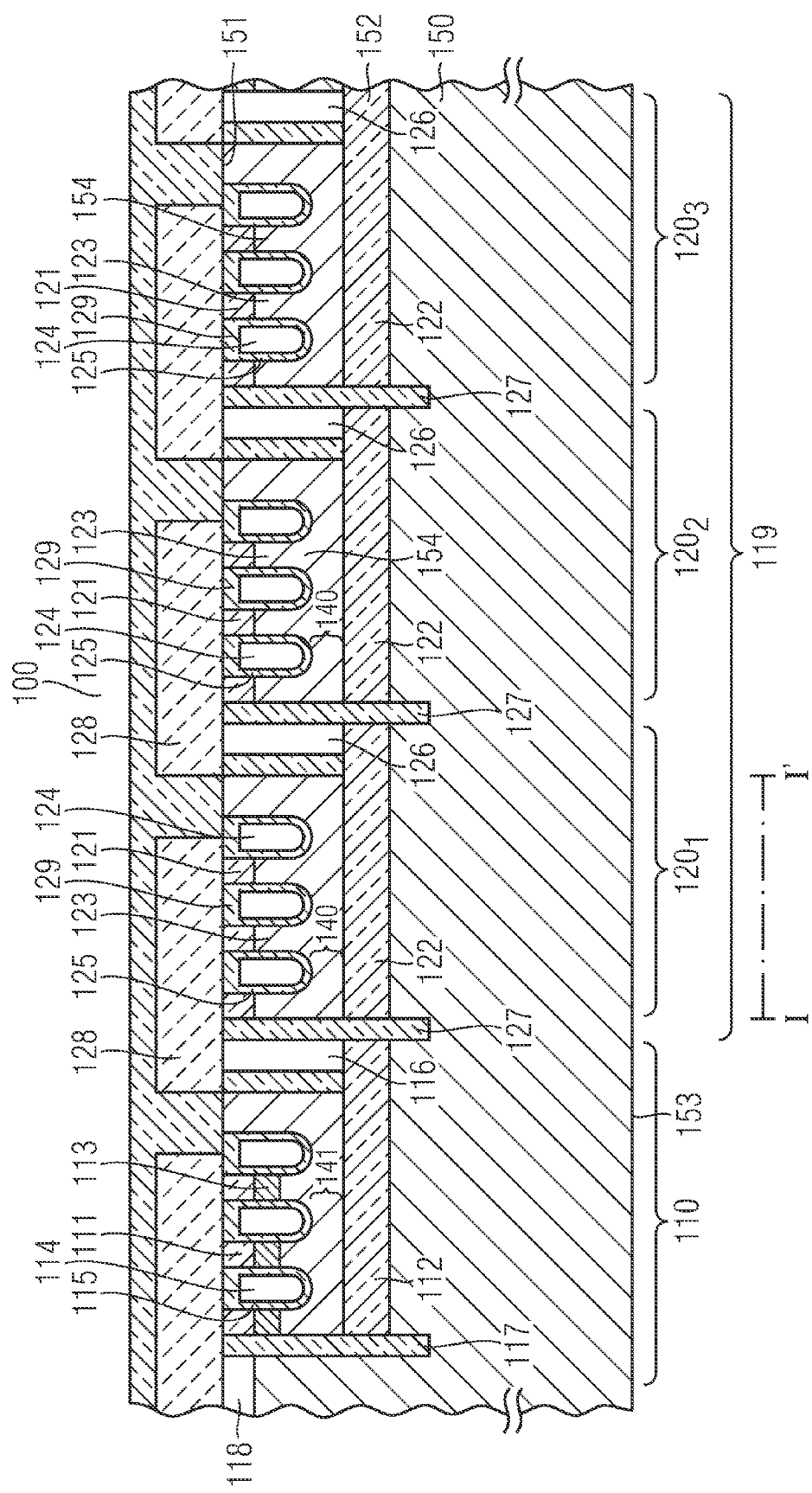

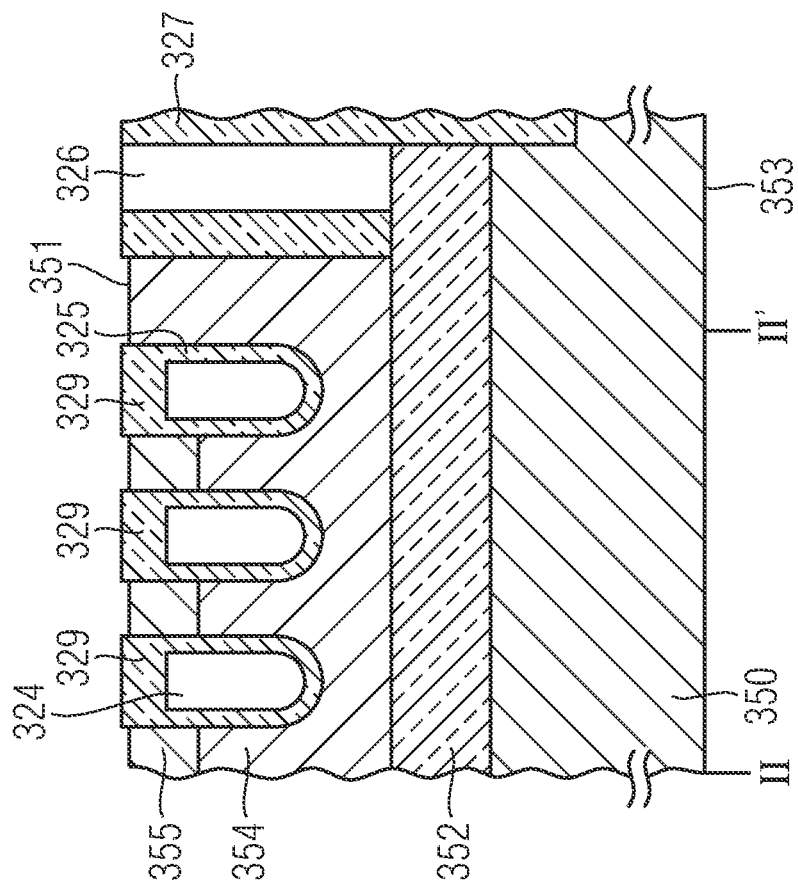
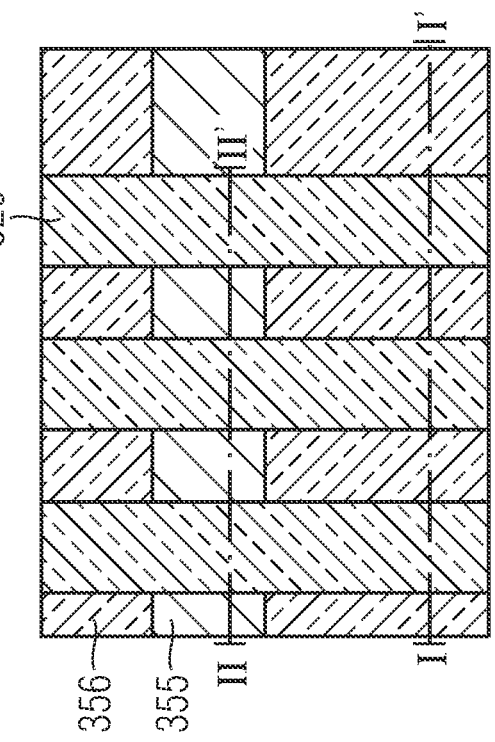

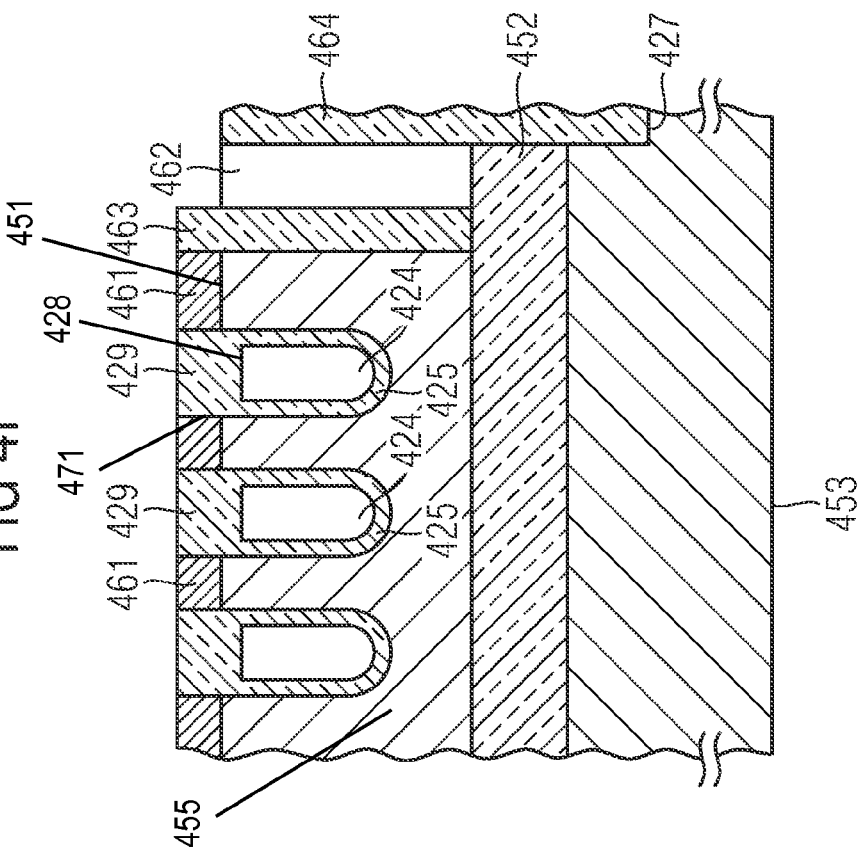
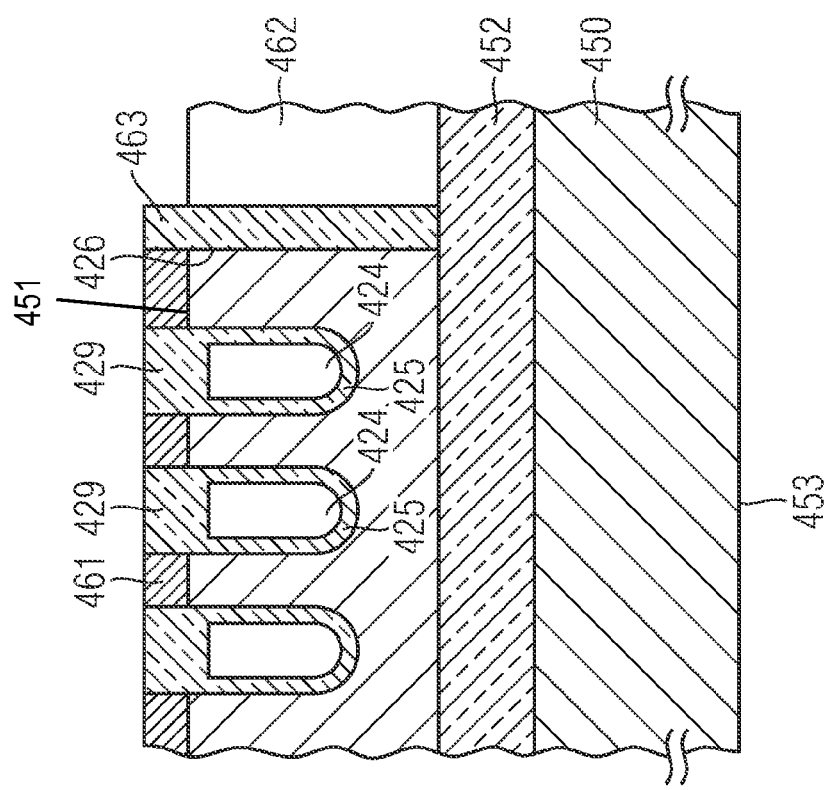

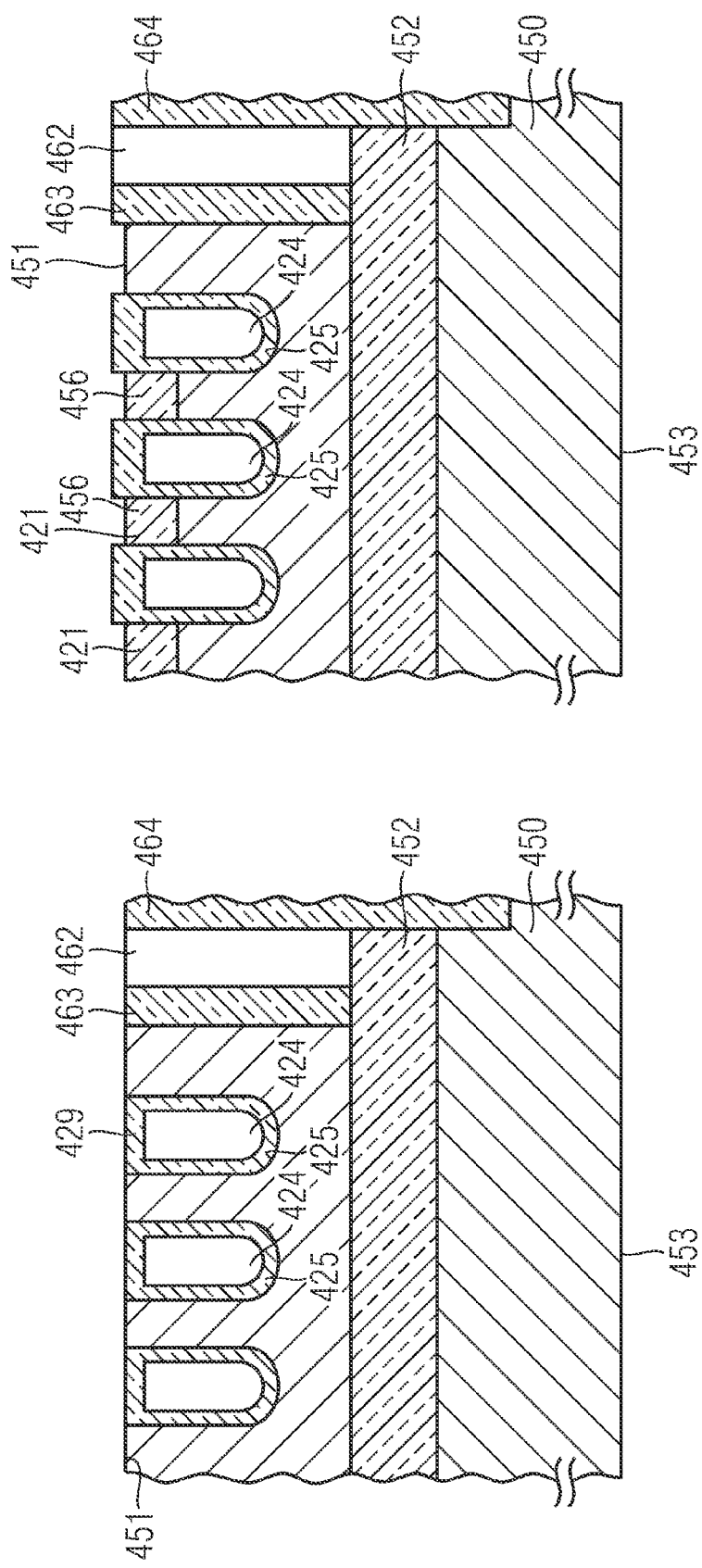

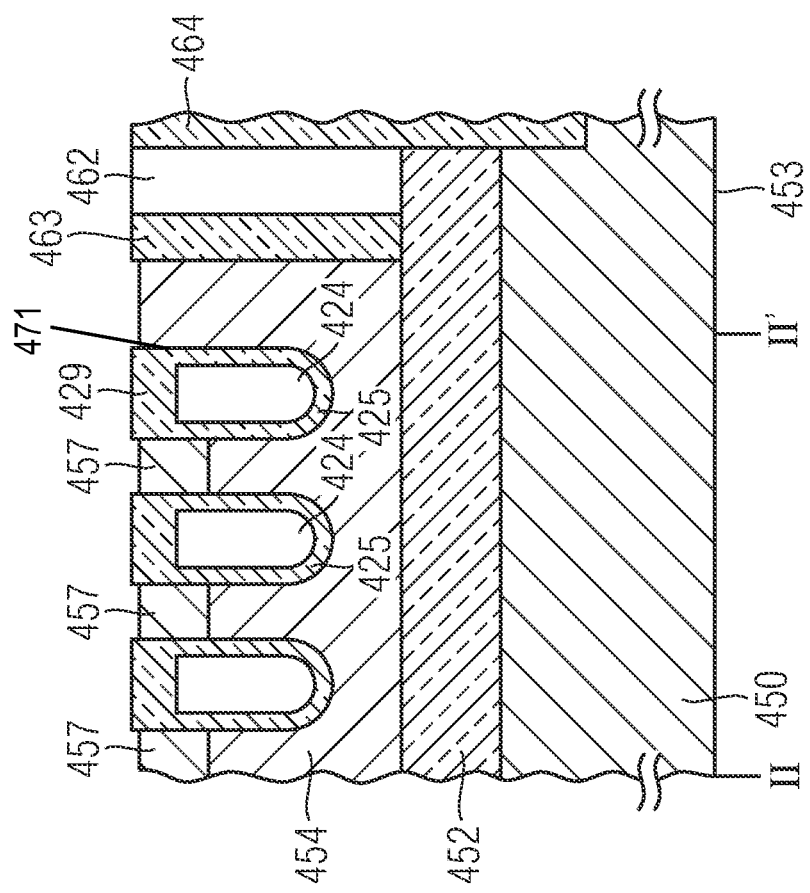

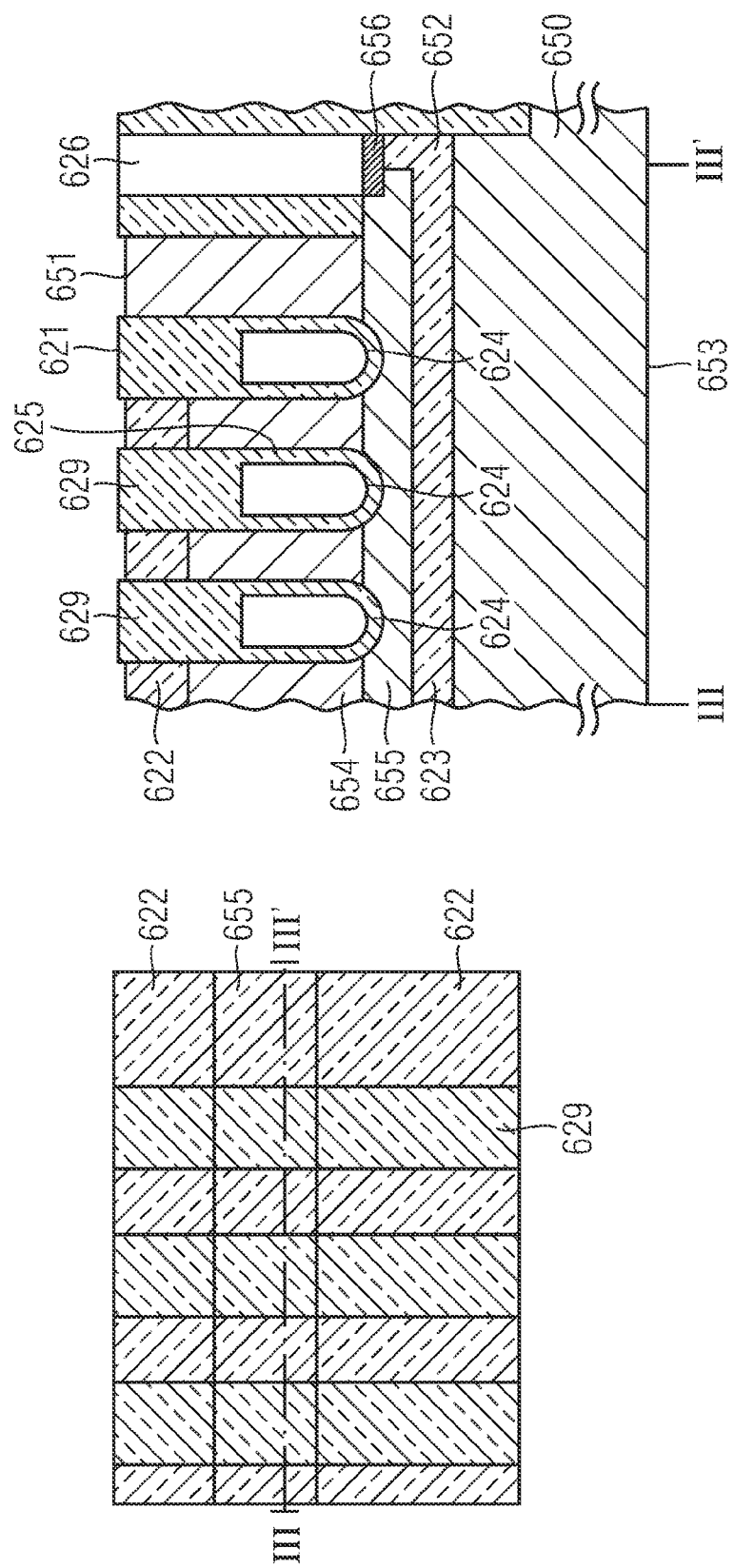

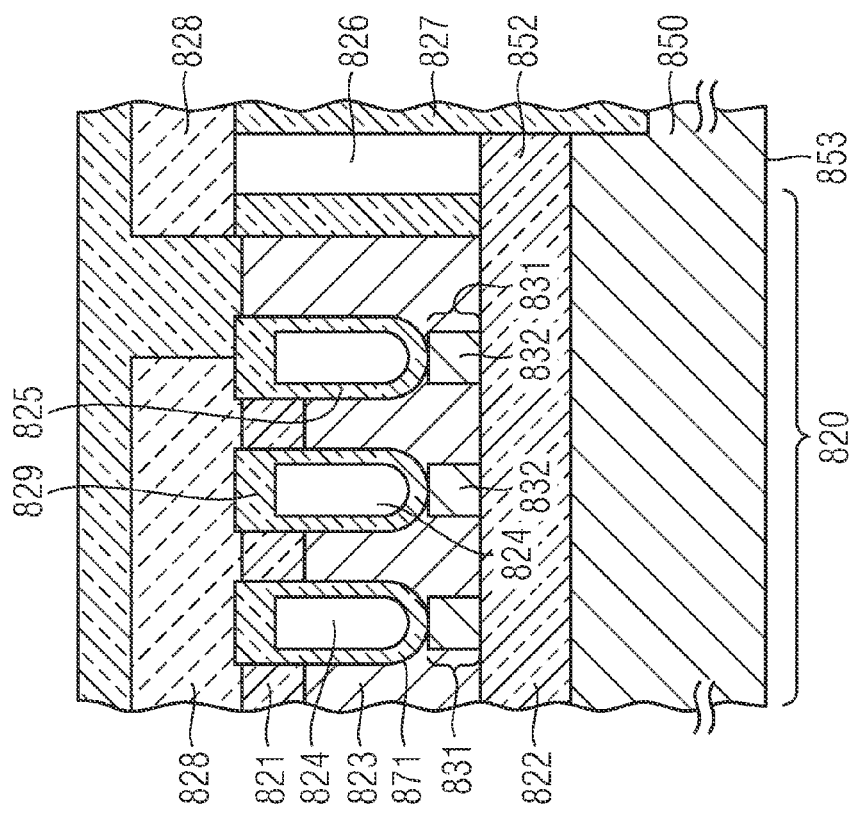
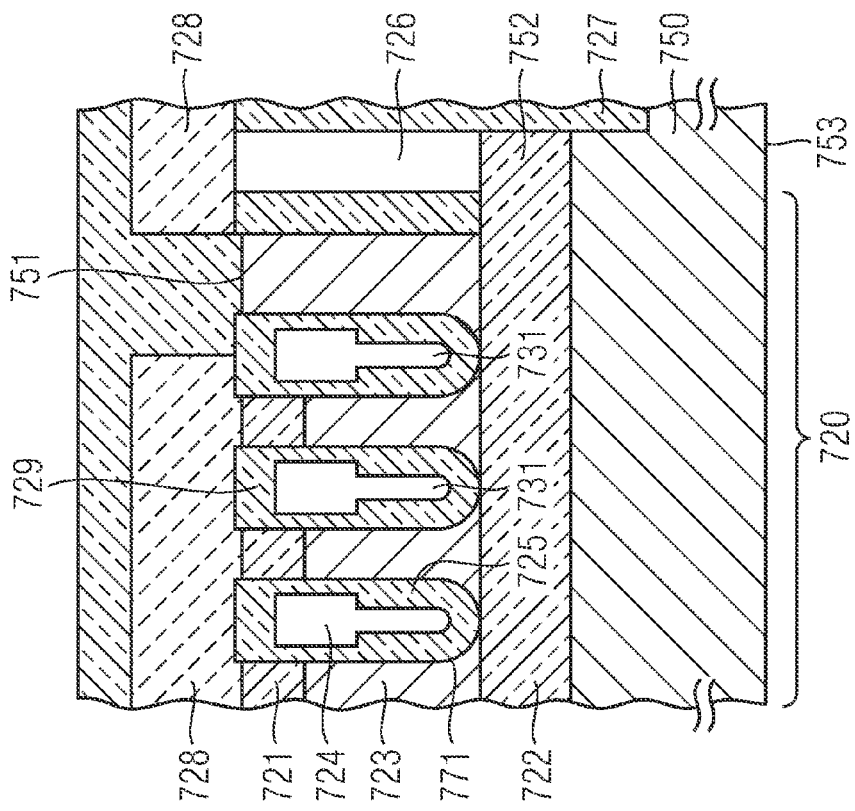

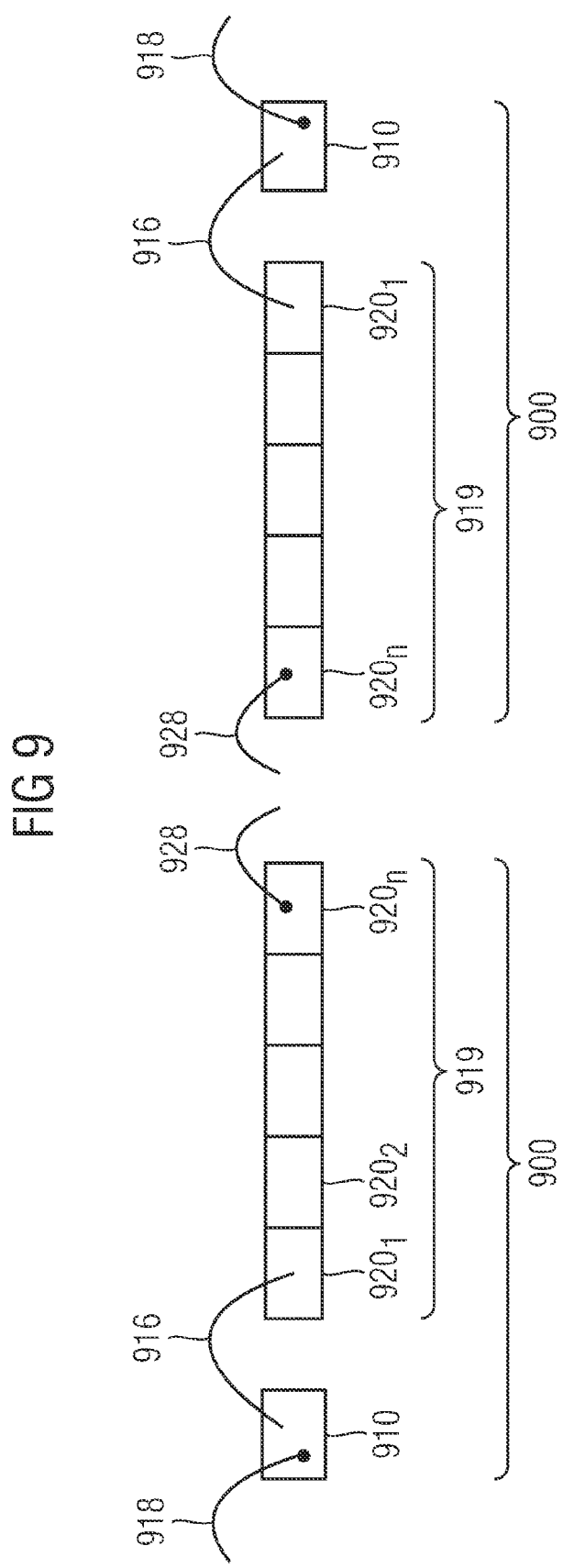

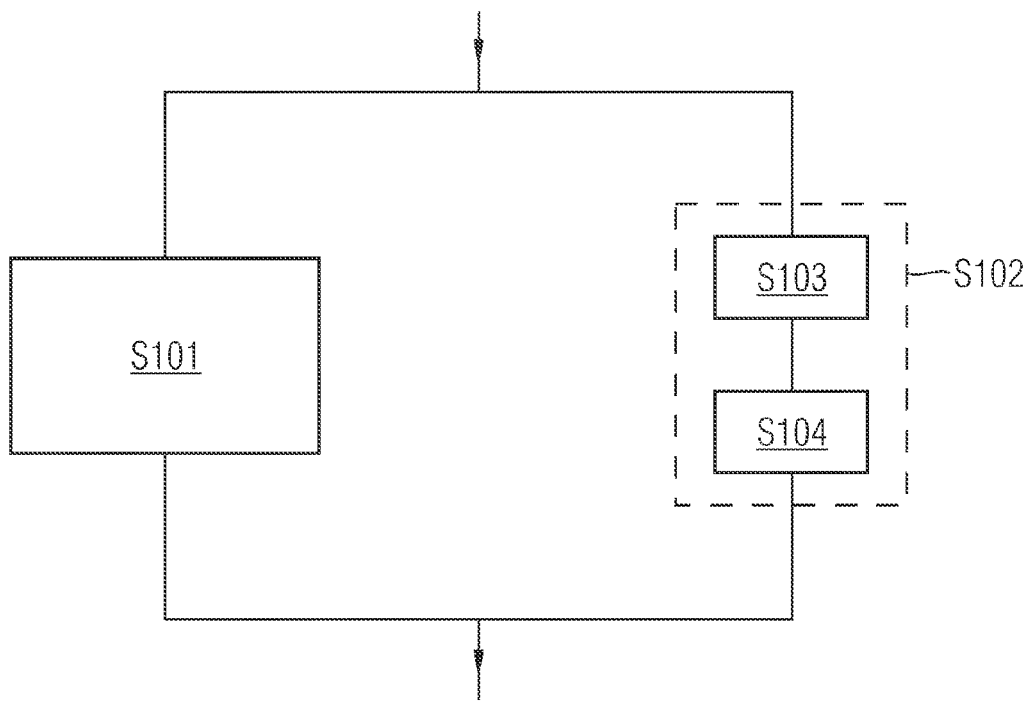

SEMICONDUCTOR DEVICE AND METHOD FOR MANUFACTURING A SEMICONDUCTOR DEVICE

BACKGROUND

The present disclosure relates to a semiconductor device and to a method for manufacturing such a semiconductor device.

Power MOSFETs (metal oxide semiconductor field effect transistor) are examples of high breakdown voltage semiconductor devices which are used for switching power sources, inverter devices or the like. For example, power MOSFETs are considered to switch high voltages at low-ohmic loads so as to have a very small switching and conduction loss. Power MOSFETs having a small on-resistance ($R_{on}$) and a high breakdown voltage when being switched off are desirable. For example, a power MOSFET should withstand a drain to source voltage $V_{ds}$ of some tens to some hundreds of volts when being switched off. As a further example, power MOSFETs conduct a very large current which may be up to some hundreds of amperes at a gate-source voltage of about 10 to 20 V at a low voltage drop $V_{ds}$.

In order to meet the increasing demands on small $R_{on}$ and high breakdown voltage, it is desirable to develop new concepts of a semiconductor device. Further, it is desirable to develop a new semiconductor device which can be manufactured by a simple process.

SUMMARY

According to an embodiment, a semiconductor device includes a first transistor with a first drift zone, and a plurality of second transistors, each second transistor including a source region, a drain region and a gate electrode, wherein the second transistors are electrically coupled in series to form a series circuit that is electrically coupled to the first transistor, the first and the plurality of second transistors being at least partially disposed in a semiconductor substrate comprising a buried doped layer, wherein the source or the drain regions of the second transistors are disposed in the buried doped layer.

According to an embodiment, a method of manufacturing a semiconductor device comprises forming a first transistor with a drift zone, and forming a plurality of second transistors, each second transistor including a source region, a drain region and a gate electrode, wherein the second transistors are formed to be electrically coupled in series to form a series circuit that is formed to be electrically coupled to the first transistor, the first and the plurality of second transistors being at least partially formed in a semiconductor substrate comprising a buried doped layer, wherein the source or the drain regions of the second transistors are formed to be disposed in the buried doped layer.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 shows a cross-sectional view of a semiconductor device according to an embodiment;

FIG. 3A shows a plan view of an element of the semiconductor device;

FIG. 3B shows a cross-sectional view of a portion of a semiconductor device according to an embodiment;

FIGS. 4A to 4K illustrate cross-sectional views of the semiconductor device according to different processing stages when manufacturing the semiconductor device according to an embodiment;

FIG. 6A shows a plan view of an element of a semiconductor device according to an embodiment;

FIG. 6B shows a cross-sectional view of a portion of a semiconductor device according to an embodiment;

FIG. 7 shows a cross-sectional view of a semiconductor device according to a further embodiment;

FIG. 8 shows a cross-sectional view of a semiconductor device of a further embodiment;

FIG. 9 shows a conceptual diagram illustrating elements of a further semiconductor device according to an embodiment; and FIG. 10 schematically illustrates a method of forming a semiconductor device.

DETAILED DESCRIPTION

Figure 2A:
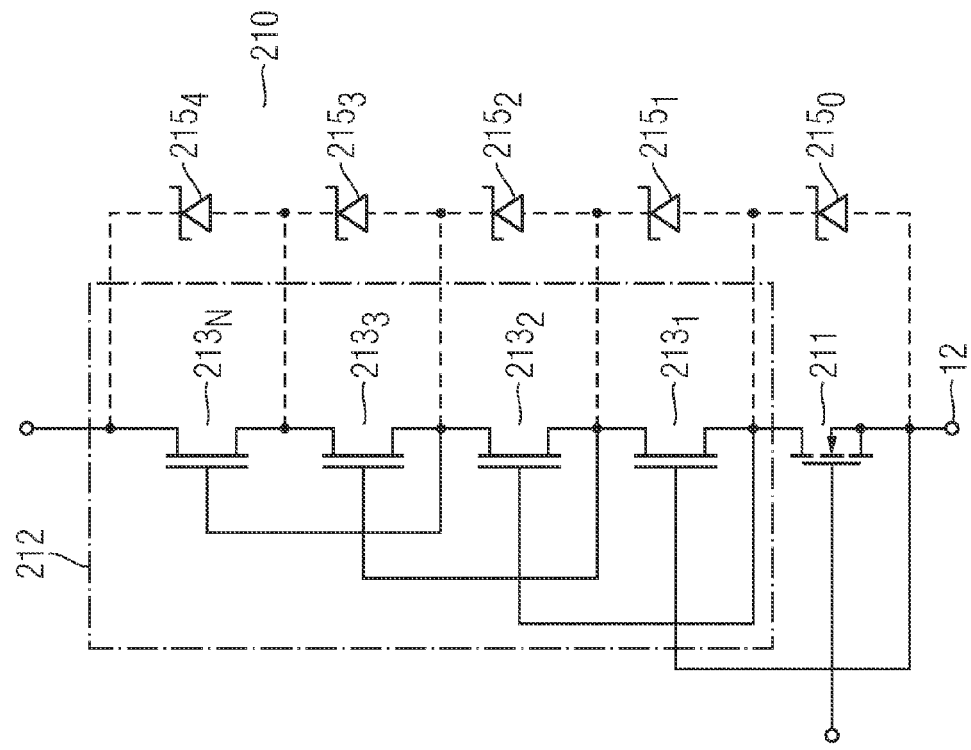
FIGS. 2A and 2B illustrate equivalent circuits of semiconductor devices according to an embodiment.

In the following detailed description reference is made to the accompanying drawings, which form a part hereof and in which is illustrated by way of illustration specific embodiments in which the invention may be practiced. In this regard, directional terminology such as "top", "bottom", "front", "back", "leading", "trailing", etc., is used with reference to the orientation of the Figures being described. Since components of embodiments of the present invention can be positioned in a number of different orientations, the directional terminology is used for purposes of illustration and in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, gallium arsenide, silicon carbide and others.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

FIG. 1 shows a cross-sectional view of a semiconductor device 100. The semiconductor device 100 comprises a first transistor 110 and a plurality of second transistors $120_1$ to $120_n$, each second transistor having a source region 121, a drain region 122 and a gate electrode 124. The second transistors $120_1$ to $120_n$ are coupled in series to form a series circuit. According to an interpretation, the series of second transistors $120_1$ to $120_n$ acts as a drift zone 119 of the first transistor. According to this interpretation, the drift zone 119 extends along a horizontal surface 151 of the semiconductor substrate 150. The first and the plurality of second transistors are at least partially disposed in the semiconductor substrate 150 comprising a buried doped layer 152. The source region 121 or the drain region 122 of each of the second transistors 120 are disposed in the buried layer 152. Since the series of second transistors $120_1$ to $120_n$ acts as the drift zone 119 of the first transistor, and the second transistors can be controlled by each of the gate electrodes 124, the semiconductor device is also referred to an "active drift zone field effect transistor (ADZFET)".

In the context of the present application, the term "buried doped layer" is intended to refer to a doped layer which is not adjacent to a surface of the substrate. For example, portions having a different doping type and/or concentration may be disposed between the buried layer 152 and the substrate surface 151. In other words, there is a distance between the substrate surface 151 and a first surface of the doped layer 152, the first surface being closer to the substrate surface 151. Further, the buried doped layer 152 is not intended to be a continuous layer but it may be segmented, for example by isolation trenches or by portions doped with a different conductivity type.

The first and the plurality of second transistors are disposed adjacent to the substrate surface 151. The channel 113 of the first transistor as well as the channels 123 of the second transistors extend in a first direction that intersects the horizontal surface 151 of the semiconductor substrate 150. For example, the channels 113 and 123 may be perpendicular to the horizontal surface 151 of the semiconductor substrate 150. The gate electrode 124 is disposed in a gate groove that may extend perpendicularly with respect to the semiconductor substrate 150. The first transistor 110 and the plurality of second transistors $120_1$ to $120_n$ are insulated from each other by a first isolation trench 117 and a plurality of second isolation trenches 127. The first isolation trench 117 and the plurality of second isolation trenches 127 are filled with an insulating material. The first and second isolation trenches extend to a depth beneath the buried layer 152. For example, the first and second isolation trenches may extend in a depth direction toward the substrate 150.

According to an embodiment, the buried layer 152 may be segmented by doped portions that are doped with the reverse dopant. For example, these doped portions may be p doped in case the buried layer is n doped.

Moreover, the first drain portion 112 is connected with the source portion 121 of the second transistor $120_1$ disposed on the left hand side of the second transistor arrangement by means of a first contact trench 116 and the transistor interconnect 128. Moreover, the drain region 122 of the transistor $120_1$ disposed on the left hand side of the second transistors is connected with the source portion 121 of the next transistor by means of the second contact trench 126 and the transistor interconnect 128. In other words, the second transistors are connected in series, the contact between adjacent transistors being accomplished by a second contact trench 126 and the transistor interconnects 128. The transistor interconnects 128 may be implemented by segments of a conductive layer that is disposed over the horizontal surface 151 of the semiconductor substrate 150.

The second contact trench 126 contacts the buried layer 152 in which the first and second drain regions 112, 122 are disposed. For example, the first contact trench 116 may be disposed adjacent to a first drift region 141 of the first transistor. The second contact trench 126 may be disposed adjacent to a second drift region 140 of the second transistor. Further, the first contact trench 116 may be disposed adjacent to the first isolation trench 117. The second contact trench 126 may be disposed adjacent to the second isolation trench 127. According to this arrangement, the contact trenches 116, 126 are insulated from adjacent drift regions, and the processing of the contact trenches and the isolation trenches can be further simplified.

The source region 111 of the first transistor 110 is connected with the substrate by means of the transistor interconnect 128 and the substrate contact 118.

For example, the first transistor 110 may be implemented as a so-called enhancement FET that has a first channel 113 having a doping type which is different from the doping type of the first and second drain portions 111, 112. The enhancement field effect transistor has a positive threshold voltage in case of an n-channel FET, or a negative threshold voltage in case of a p-channel FET. The enhancement field effect transistor is set to an off-state at a zero gate voltage. Moreover, the second transistors may be implemented as depletion field effect transistor which means that they have a threshold voltage below 0 V in case of an n-channel FET, or above 0 V in case of a p-channel FET. The depletion field effect transistor is set to an on-state at a zero gate voltage. The channel 123 is doped with the same doping type as the second source and drain portions 121, 122.

In the example illustrated in FIG. 1 the substrate is p-doped, and the source and the drain regions are n-doped. For example, the drain regions 112, 122, may be implemented by a n$^+$-doped buried layer. According to this example, the channel 113 of the first transistor 110 is p-doped and the channel 123 of the second transistors 120 is lightly n-doped.

In the arrangement shown in FIG. 1, each of the first and second transistors is implemented as a so-called vertical semiconductor device. Source portions 121 may be disposed adjacent to the first surface 151 of the semiconductor substrate 150. Gate trenches are disposed in the first surface 151 of the semiconductor substrate. The gate electrode 124 is disposed within the gate trenches, the gate electrode being insulated from the adjacent body region 154 by a gate dielectric material 125. The channel region 123 is disposed adjacent to the gate electrode 124. The body region 154 of the second transistors 120 comprises the second channels 123 and, thus, has the same conductivity type as the source and drain regions. For example, portions of the body region 154 are disposed adjacent to the second drift region 140.

When being switched on, for example, by applying a positive gate voltage an inversion layer is formed at the boundary between the first channel region 113 and the gate dielectric material 115. Accordingly, the transistor is in a conducting state from the first source region 111 to the first drain region 112 via the first drift region 141. In case of switching off, no inversion layer is formed and the transistor is not in a conducting state.

Further, when a positive or zero voltage is applied to the second gate electrode 124, an accumulation layer may be formed at the boundary between the second channel region 123 and the second gate dielectric material 125. Accordingly, with a positive or zero gate voltage being applied, the second transistor is in a conducting state from the first source region 121 to the second drain region 122. In case of switching-off, the second transistors are set in a non-conductive state. Hence, by an appropriate circuit design, which will be discussed herein below with reference to FIG. 2, when the first transistor is in an on-state, the second transistors will be set in an on-state, thereby decreasing the on resistance. When the first transistor is in an off-state, the second transistors will be set in an off-state, thereby increasing the breakdown voltage.

As is shown in FIG. 1, the series of the first transistor and the plurality of second transistors is formed adjacent to a first surface 151 of the semiconductor substrate. Further, each of the first and the second drain regions are formed as a buried layer within the semiconductor substrate 150. Accordingly, each of the first and the second transistors are implemented as vertical devices. As a consequence, the product of R$_{on}$ X area of the semiconductor device can further be improved. Moreover, due to the arrangement shown in FIG. 1, the whole area beneath the sequence of transistors may be used as a drift zone 119, whereby the breakdown voltage is further increased. In other words, the semiconductor device comprises a series connection of a first transistor and of a plurality of second transistors according to which, when the first transistor is in an on-state, the second transistors are in an on-state and when the first transistor is in an off-state, the second transistors are in an off-state. Additionally, the first and the second transistors are implemented as vertical power devices. As a consequence, the resulting semiconductor device has improved characteristics.

The embodiment of FIG. 1 shows an arrangement according to which each of the first and second transistors is implemented by three transistor cells that are connected in parallel. The transistors of each transistor cell may have a common gate electrode. Further, the source portions 121 are electrically coupled by the transistor interconnects 128. As is to be clearly understood, each of the first and second transistors may comprise an arbitrary number of transistor cells, and the number may be different for the first and the second transistor.

FIG. 2A shows an equivalent circuit diagram of a semiconductor device according to an embodiment. As is illustrated in FIG. 2A, the semiconductor device 200 comprises a first transistor 201 and a plurality of second transistors $203_1$ to $203_n$. The first transistor 201 comprises a source region S, a drain region D, and a gate electrode G. When a suitable voltage is applied to the gate electrode, the first transistor 201 is in an on-state. Further, a plurality of second transistors $203_1$ to $203_n$ are connected in series with each other and to the first transistor 201. According to an interpretation, the series of second transistors $203_1$ to $203_n$ acts as a drift zone 202 of the first transistor. According to this interpretation, the terminal 31 acts as a drain terminal of the resulting power semiconductor device.

As is shown, the output of the first transistor 201 at the terminal 32 is applied to transistor $203_2$ as gate voltage $V_{gs1}$. Moreover, the source voltage is also applied as the gate voltage to the transistor $203_1$. Each of the second transistors $203_1 \ldots 203_n$ has its gate electrode connected to the drain terminal of another one of the second transistors $203_1 \ldots 203_n$ or to the source or the drain terminal of the first transistor 201. Accordingly, as is illustrated in FIG. 2A, the output of any transistor in the transistor series determines the gate voltage which is applied to a transistor at a later position within the series. Hence, depending on the output at the drain region D, the overall resistance of the series of the second transistor $203_1$ to $203_n$ can be determined. The semiconductor device thus forms a so-called ADZFET ("active drift zone field effect transistor").

Figure 2B:
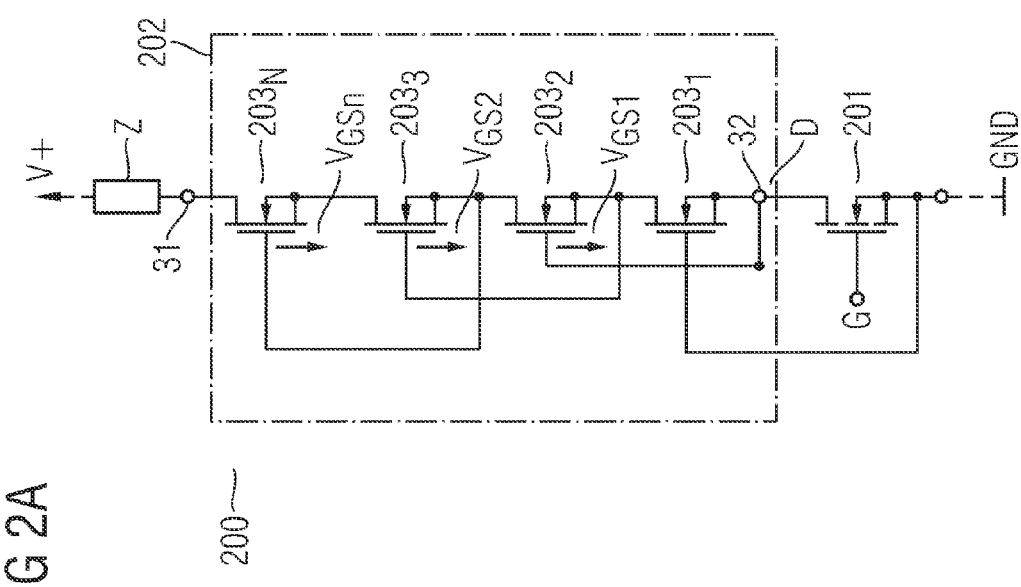

FIG. 2B shows an equivalent circuit diagram of a semiconductor device according to a further embodiment. The semiconductor device 210 of FIG. 2B additionally comprises a plurality of clamping elements $215_0$ to $215_4$. Each of the clamping elements is connected in parallel to each of the second transistors 203 and the first transistor 211, respectively. For example, the clamping element may include Zener diodes or other suitable elements such as tunnel diodes, PIN diodes, avalanche diodes or the like. The clamping elements $215_0$ to $215_4$ provide an over-voltage protection for the single transistors. A detailed description of the clamping element $215_0$ to $215_4$ will be omitted in the following description. Nevertheless, it is clearly to be understood, they may be easily accomplished by way of correspondingly implanted semiconductor areas in the peripheries of the illustrated cross-sectional views.

FIGS. 2A and 2B merely represent equivalent circuit diagrams for interconnecting elements of the semiconductor device. As is to be clearly understood, according to further embodiments, different interconnection schemes may be employed.

FIG. 3 shows a detailed view of a portion of the first and second transistors.

FIG. 3A shows a plan view of a substrate 350 comprising doped portions 351. FIG. 3B shows a cross-sectional view between II and II' as illustrated in FIG. 3A. In this respect, it is noted that a cross-sectional view between I and I' is, for example, shown in FIG. 1. In the plan view shown in FIG. 3A, gate trenches extend in a first direction, an insulating cap layer 329 being disposed in the gate trenches adjacent to the surface. An implanted portion 355 is provided so as to intersect the gate trenches. In the embodiment of FIG. 3A, the implanted portions 355 extend perpendicularly with respect to the gate trenches. The implanted portion 355 may extend along the whole gate trench array as is shown in FIG. 3A, or may extend along a part of the gate trench array as is shown in FIG. 3B. In the cross-sectional view shown in FIG. 3B, the doped portion 355 is disposed adjacent to the semiconductor body 354 in which the first or the second transistor is formed. The doped portion 355 forms the body contact implant. FIG. 3B further shows a buried doped portion 352, a body portion 354, a gate electrode 324 and a gate dielectric layer 325 as well as the second contact trenches 326 and the second isolation trenches 327. The body contact implant 355 is of a conductivity type which is different from the conductivity type of the buried doped layer 352 and the source doping. Due to the presence of the body contact implant 355, the body region 354 may be connected with a source potential so as to suppress parasitic effects which may be caused due to impact ionization when the transistor is set to an off-state. In particular, when the transistor is in an off-state, holes are subtracted from the transistor. These body contact implants 355, which implement body connections, are applied to the first and the second transistors.

Figure 4B:
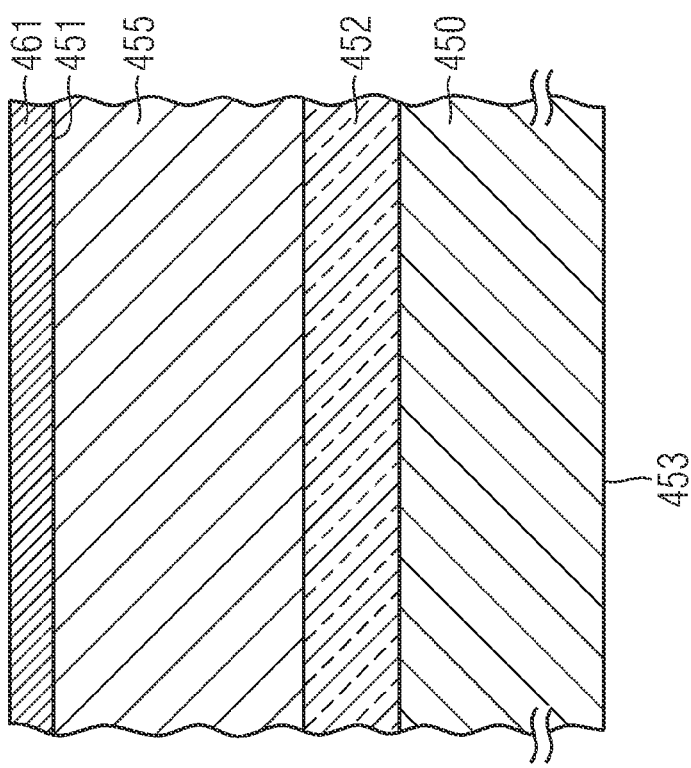
Figure 4A:
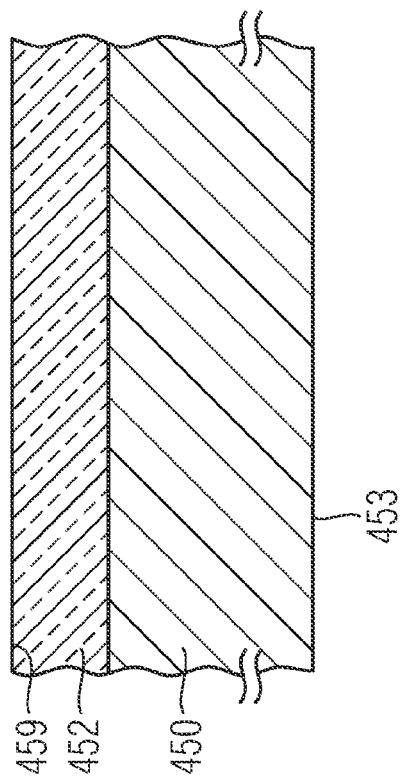

FIGS. 4A to 4K illustrate different stages during the manufacture of the semiconductor device. A doped portion 452 is formed adjacent to an intermediate surface 459 of a semiconductor substrate. The semiconductor substrate 450 may have a first conductivity type, for example p-type. The doped layer 452 may have a second conductivity type which is different from the first conductivity type. For example, the doped layer 452 may be n-doped. The intermediate surface 459 may be opposite to a back side of the substrate 453. FIG. 4A shows an example of a resulting substrate. Thereafter, an epitaxial step may be performed to form a doped portion of the second conductivity type 455. The drift portion and the channel portion of the first and second transistors may be formed in this doped portion 455 in a later processing step. Accordingly, a doping profile of this doped layer 455 may appropriately be adjusted. For example, the doped layer 455 may be formed by epitaxy. Nevertheless, as is clearly to be understood, the buried doped layer 452 may be formed by any arbitrary method within a semiconductor substrate. Over the third surface 451 of the resulting substrate, a thin silicon oxide layer (not shown) serving as a pad oxide layer may be formed, followed by a silicon nitride layer 461. FIG. 4B shows an example of a resulting structure.

Figure 4D:
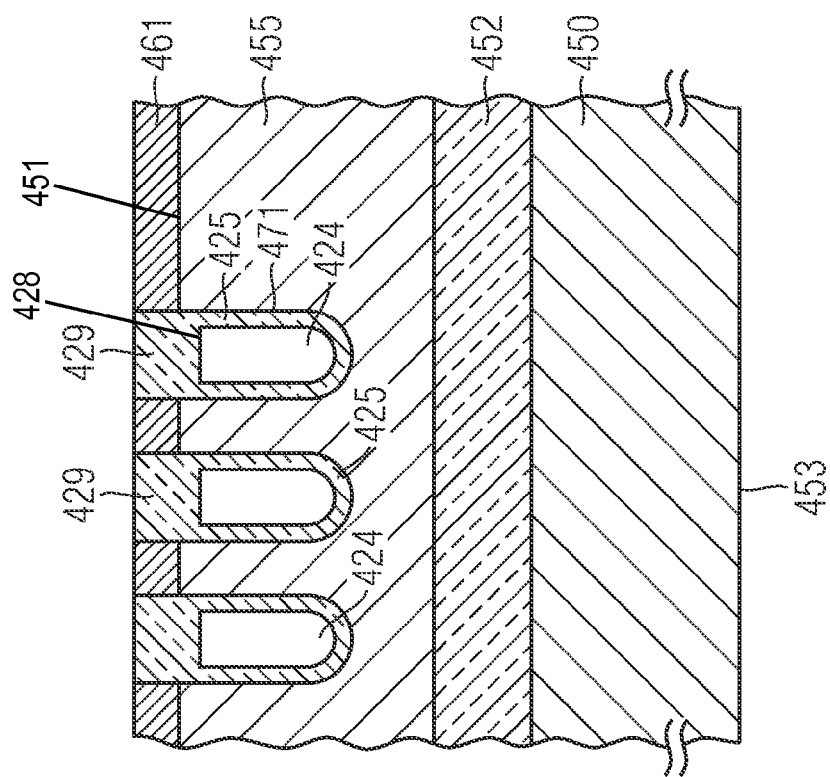
Figure 4C:
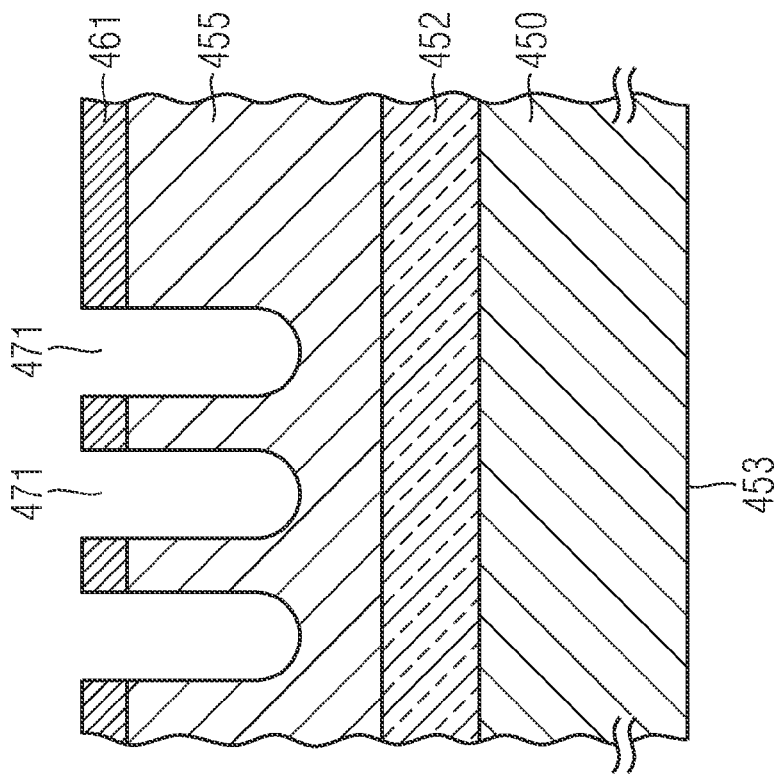

Thereafter, gate trenches 471 are formed in the doped layer 455. The depth and the distance between adjacent trenches depends from the desired breakdown voltage of the resulting transistors. For example, the trenches may have a depth of 300 nm to 2 µm. The trenches 471 are photolithographically defined, followed by a suitable etching step. For example, further hard mask layers may be disposed over the silicon nitride layer 461 during the patterning process. FIG. 4C shows an example of a resulting structure.

Thereafter, a gate oxide layer 425 may be formed in the gate trenches 471. Thereafter, doped polysilicon may be deposited to fill the trenches 471. Thereafter, a lithographic step may be performed for defining portions of the polysilicon, at which portions contact areas are to be formed, for example at an edge of the device. Thereafter, an etching step may be performed so as to recess the polysilicon material to form gate electrodes 424 within the gate trenches 471. As a result, the upper surface 428 of the gate electrodes 424 is disposed beneath the surface 451 of the doped portion 455. Thereafter, an oxide layer may be deposited, followed by an etching step or a recessing step or a CMP (chemical mechanical polishing step) so as to form a planar surface. As a result, the cap insulating layer 429 is formed over the gate electrodes 424 within the gate trenches 471. FIG. 4D shows an example of the resulting structure.

Thereafter, contacts to the buried doped layer 452 are formed. For example, a contact trench 426 may be photolithographically defined in the substrate surface. Then, an insulating material 463 such as silicon oxide may be deposited, followed by a so-called spacer etching process which mainly etches the horizontal portions of the deposited oxide layer, whereas the vertical portions of the layers are maintained. Thereafter, a conductive material such as heavily $n^+$-doped polysilicon is filled in the contact trench 426 to accomplish a contact to the buried layer 452. Thereafter, a recess etching step may be performed so that the surface of the buried layer contact material 462 is approximately at the same height as the first surface 451 of the doped portion 455. Next, a further lithographic step may be performed so as to define an isolation trench 427. This isolation trench 427 will be filled with a separating material 464 such as silicon oxide. Thereafter, a recess etching step or CMP step may be performed so that the upper surface of the separating material 464 is approximately at the same height as the buried layer contact material 462. The insulating material 463 insulates the buried layer contact material 462 from the body region 454. The isolation trench 427 insulates adjacent second transistors 420.

An example of a resulting structure is shown in FIG. 4F. Thereafter, a deglazing step with hydrofluoric acid is performed, followed by a pad nitride stripping step for removing the silicon nitride layer 461. For example, this may be accomplished by a wet etching step. Thereafter, the portions in which the source regions 421 are to be formed are photolithographically defined. Then, an implantation step for defining the source regions 421 is performed. For example, this may be accomplished by doping with n-type impurities. For example, an n-implantation step may be performed so as to provide the doped portion 456. FIG. 4H shows an example of a resulting structure.

A further lithographic step may be performed so as to define the portions in which the body contacts are to be formed. As is shown, the doped portion 457 for the body connection is defined to extend perpendicularly with respect to the gate trenches 471. Thereafter, an implantation step with a first conductivity type is performed. For example, this doping step may be performed using p-type impurities. FIG. 4I shows a plan view of a part of the corresponding structure. Moreover, FIG. 4J shows a cross-sectional view of the resulting structure.

Figure 4K:
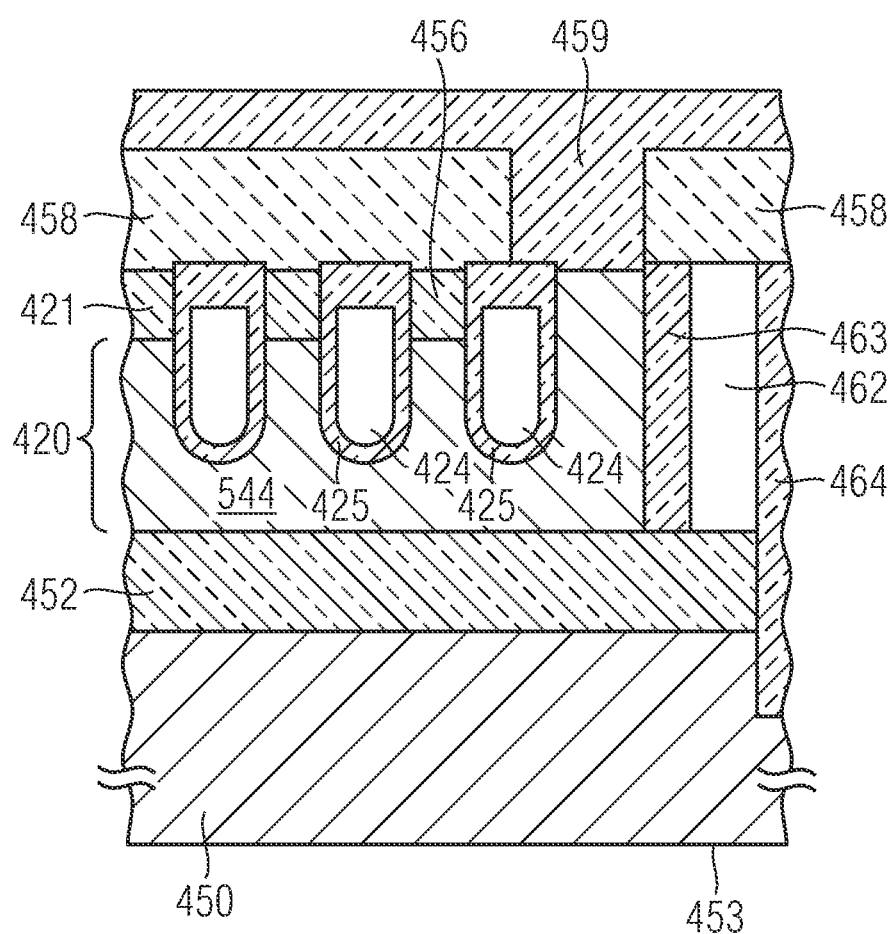

Thereafter, metallization steps and steps for defining insulating portions are performed so as to define the contact portions 458. For example, as shown in FIG. 4K, the contact portions 458 connect the buried layer contact material 462 with the source electrode 456. Further, insulating material 459 may be provided so as to insulate adjacent contact portions 458 from each other.

Figure 5:
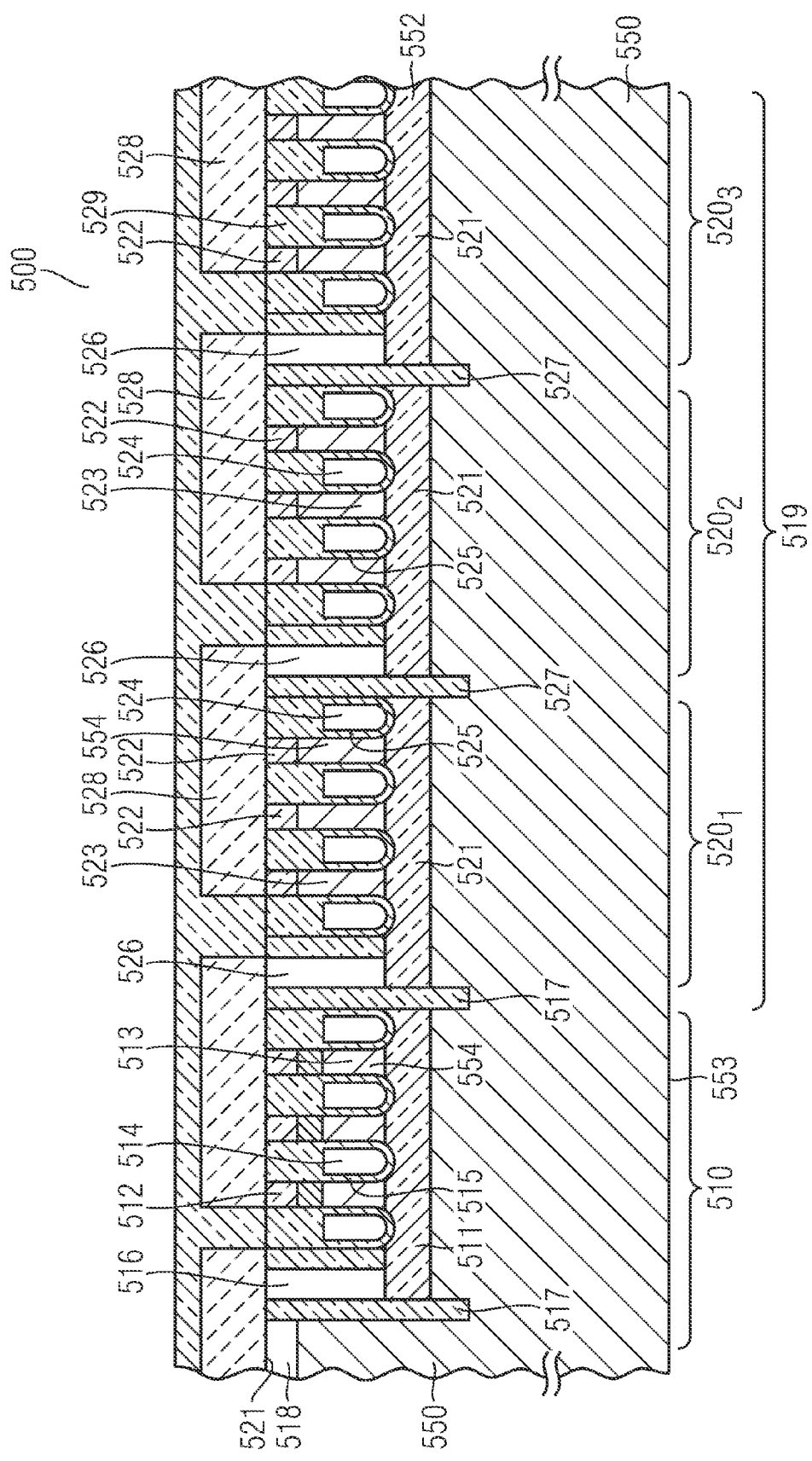
FIG. 5 shows a cross-sectional view of the semiconductor device according to a further embodiment.

FIG. 5 shows a further embodiment. As is shown in the embodiment of FIG. 5, the source portions 521 are formed in the buried doped layer 552 that is disposed within the semiconductor substrate 550. Accordingly, the drain region 512 of the first transistor 510 is connected with the second source region of the second transistor $520_1$ by a second contact 526 that is implemented as a vertical contact. Moreover, the second drain region 522 of the second transistor $520_1$ is connected with the second source region 521 of the second transistor $520_2$ by means of a further second contact 526 which extends vertically. The first source region 511 of the first transistor 510 is connected with the metallization layer via the first source contact region 516. The further components shown in FIG. 5 correspond to those shown in FIG. 1 wherein in the first digit of the three digit reference numerals "1" have been replaced by "5".

FIGS. 6A and 6B illustrate an embodiment in which the source electrode 511, 521 is formed within the buried layer 552, and in which there is a body contact implant 655. The cross-sectional view of FIG. 6B is taken between III and III' in FIG. 6A.

The schematic layout shown in the plan view of FIG. 6A basically corresponds to that of the plan view of FIG. 3A. Nevertheless, as can be seen from FIG. 6B, the body contact implant 655 is implemented as a buried layer in contact with the buried doped layer 652 in which the source regions are disposed. The gate trenches 671 are formed to contact the body contact implantation layer 655. Further, the body contact implant 655 may be connected with the second contact trench 626 by means of a further contact portion 656 such as a Ti silicide layer.

Further elements of FIG. 6B correspond to those of FIG. 3B, wherein in the first digit of the three digit reference numerals "3" has been replaced by "6".

The described concept may be implemented in various manners. For example, FIG. 7 shows an embodiment, in which in addition to the gate electrode 724 a field plate 731 is disposed within the gate trenches 771. In the embodiment shown in FIG. 7, the gate trenches 771 are formed so as to extend to a depth of the upper surface of the buried doped layer 752 in which the source or drain regions are disposed. The field plate 731 may be connected with the gate electrode 724 or may be electrically insulated from the gate electrode. The further elements of FIG. 7 are similar or identical to those illustrated in FIG. 1, wherein in the first digit of the three digit reference numerals "1" has been replaced by "7".

The vertical field plate which is shown in FIG. 7 enables a charge compensation in the power device. For example, the field plate 731 may be connected with a source potential. Further, the field plate may enable a higher doping concentration of the drift region while it is still possible to deplete the drift region.

FIG. 8 shows a further embodiment, in which beneath each of the gate trenches 871, a second compensation portion 832 may be disposed. Thereby, a so-called superjunction semiconductor device which includes a charge compensation zone may be formed. When the transistor is switched to an off-state, carriers are compensated between the second compensation portion 832 and the second drift zone 831. As a consequence, a breakdown voltage may be maintained as the doping concentration of the first zone is increased. The further components of the embodiment of FIG. 8 are similar or identical to the respective components of the embodiment of FIG. 1, wherein the first digit "1" of the three digit reference numerals have been replaced by "8". The second compensation portion 832 is disposed so as to extend between the lower edge of the gate trenches 871 to the upper surface of the doped portion 852.

FIG. 9 shows a schematical arrangement of first transistors 910 and second transistors $920_1$ to $920_n$. A first contact 916 is disposed between the first transistor 910 and the series of second transistors 920. The first transistor is connected with the substrate via a substrate contact 918. Moreover, the last drain portion of the series of second transistors is connected with a second drain contact 928. When a source/drain voltage is applied to the semiconductor device 900, the first source region of the first transistor 910 is at ground voltage and the drain region of the second transistor $920_n$ is at a comparably high voltage. When arranging a plurality of the semiconductor devices in a single substrate, the next semiconductor substrate may be disposed mirror-inverted to the first semiconductor device 900 so as to avoid that a high voltage difference is present between two adjacent semiconductor devices. As a consequence, the width of the insulating trench between adjacent semiconductor devices 900 may be decreased. As is shown in FIG. 9, the right-hand semiconductor device 900 is disposed mirror-inverted to the semiconductor device 900 on the left-hand side.

FIG. 10 schematically illustrate steps of the method for manufacturing a semiconductor device. A method for manufacturing a semiconductor device comprises forming a first transistor with a first drift zone (S101), and forming a plurality of second transistors (S102), each second transistor comprising a source region, a drain region and a gate electrode, wherein the second transistors are formed to be coupled in series to form a series circuit that is formed to be coupled to the first transistor, the first and the plurality of second transistors being at least partially formed in a semiconductor substrate comprising a buried doped layer, wherein forming the second transistors comprises forming a buried doped layer (S103) in the semiconductor and forming the source or the drain regions of the second transistors in the buried doped layer (S104). The temporal sequence of the single steps can be chosen in accordance with processing requirements. Components of the first and the second transistors may be formed by parallel processes.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device, comprising:
   a first transistor with a first drift zone, and
   a plurality of second transistors, each second transistor comprising a source region, a drain region and a gate electrode,
   wherein the second transistors are electrically coupled in series to form a series circuit that is electrically coupled to the first transistor, the first and the plurality of second transistors being at least partially disposed in a semiconductor substrate comprising a buried doped layer, wherein the source or the drain regions of the second transistors are disposed in the buried doped layer.

2. The semiconductor device of claim 1, wherein the drain regions of the second transistors are disposed in the buried doped layer.

3. The semiconductor device of claim 1, wherein a source region of the first transistor and respective source regions of each of the plurality of second transistors are disposed adjacent to a surface of the semiconductor substrate.

4. The semiconductor device of claim 1, wherein the source regions of the second transistors are disposed in the buried doped layer.

5. The semiconductor device of claim 1, wherein a drain region of the first transistor and respective drain regions of each of the plurality of second transistors are disposed adjacent to a surface of the semiconductor substrate.

6. The semiconductor device of claim 1, wherein the source region and the drain region of the second transistors are arranged distant from each other in a first direction intersecting a surface of the semiconductor substrate.

7. The semiconductor device of claim 1, further comprising a body contact region in contact with a body portion of the first and second transistors.

8. The semiconductor device according to claim 1, wherein the gate electrode of each of the second transistors is disposed in a gate trench that is disposed within a surface of the semiconductor substrate.

9. The semiconductor device of claim 7, wherein a field plate is disposed beneath the gate electrode within the gate trench.

10. The semiconductor device of claim 1, wherein each of the second transistors is a superjunction semiconductor device.

11. The semiconductor device of claim 1, wherein the source or the drain region of the first transistor is disposed in the buried doped layer.

12. The semiconductor device of claim 1, further comprising isolation trenches which are disposed between the second transistors.

13. The semiconductor device of claim 1, wherein each of the second transistors comprises at least two transistor cells that are connected in parallel.

14. The semiconductor device of claim 1, wherein the semiconductor substrate is doped with a first conductivity type, and the buried layer is doped with a second conductivity type, the second conductivity type being different from the first conductivity type.

15. The semiconductor device of claim 1, further comprising contact trenches that electrically couple the drain region of one of the second transistors with the source region of an adjacent second transistor, the contact trenches extending in a depth direction of the substrate.

16. The semiconductor device of claim 15, wherein the contact trenches extend along a second drift region of each of the second transistors.

17. The semiconductor device of claim 15, wherein the contact trenches are arranged adjacent to isolation trenches that insulate adjacent second transistors from each other.

18. The semiconductor device of claim 6, wherein each of the second transistors comprises a second drift region, the second drift region extending in the first direction.

19. The semiconductor device of claim 1, wherein the first transistor is an enhancement type field effect transistor and each of the second transistors is a depletion type field effect transistor.

20. A method of manufacturing a semiconductor device, comprising:
    forming a first transistor with a drift zone, and
    forming a plurality of second transistors, each second transistor comprising a source region, a drain region and a gate electrode,
    wherein the second transistors are formed to be electrically coupled in series to form a series circuit that is formed to be electrically coupled to the first transistor, the first and the plurality of second transistors being at least partially formed in a semiconductor substrate comprising a buried doped layer, wherein the source or the drain regions of the second transistors are formed to be disposed in the buried doped layer.

* * * * *